United States Patent
Lin

(10) Patent No.: US 9,130,166 B2
(45) Date of Patent: Sep. 8, 2015

(54) RESISTIVE NON-VOLATILE MEMORY, CELL STRUCTURE AND MANUFACTURING METHOD THEREOF

(71) Applicant: Chrong-Jung Lin, Hsinchu (TW)

(72) Inventor: Chrong-Jung Lin, Hsinchu (TW)

(73) Assignee: Chrong-Jung Lin, Hsinchu (TW)

( * ) Notice: Subject to any disclaimer, the term of this patent is extended or adjusted under 35 U.S.C. 154(b) by 0 days.

(21) Appl. No.: 14/315,798

(22) Filed: Jun. 26, 2014

(65) Prior Publication Data

US 2015/0200232 A1    Jul. 16, 2015

(30) Foreign Application Priority Data

Jan. 15, 2014   (TW) .............................. 103101392 A

(51) Int. Cl.
| | |
|---|---|
| *H01L 45/00* | (2006.01) |
| *H01L 27/24* | (2006.01) |
| *H01L 23/532* | (2006.01) |

(52) U.S. Cl.
CPC ...... *H01L 45/1633* (2013.01); *H01L 23/53214* (2013.01); *H01L 23/53228* (2013.01); *H01L 23/53257* (2013.01); *H01L 27/2463* (2013.01); *H01L 45/04* (2013.01); *H01L 45/06* (2013.01); *H01L 45/122* (2013.01); *H01L 45/1233* (2013.01); *H01L 45/145* (2013.01); *H01L 45/146* (2013.01); *H01L 45/1608* (2013.01)

(58) Field of Classification Search
CPC ......... H01L 45/00; H01L 45/04; H01L 45/12; H01L 45/122; H01L 45/1233; H01L 45/145; H01L 45/1608; H01L 45/1633
See application file for complete search history.

(56) References Cited

U.S. PATENT DOCUMENTS

| | | | |
|---|---|---|---|
| 7,400,006 B1 * | 7/2008 | Rinerson et al. .............. | 257/295 |
| 8,107,274 B2 | 1/2012 | Lin et al. | |
| 2004/0159828 A1 * | 8/2004 | Rinerson et al. .................. | 257/2 |
| 2007/0065961 A1 * | 3/2007 | Park et al. ........................ | 438/43 |
| 2009/0163018 A1 * | 6/2009 | Avanzino et al. ............ | 438/600 |
| 2012/0091427 A1 * | 4/2012 | Chen et al. ........................ | 257/5 |
| 2012/0267595 A1 * | 10/2012 | Fang et al. ........................ | 257/2 |
| 2013/0122651 A1 * | 5/2013 | Fujii et al. ........................ | 438/104 |
| 2013/0270510 A1 * | 10/2013 | Fujii et al. ........................ | 257/5 |

OTHER PUBLICATIONS

Hsieh et al., "Ultra High Density 3D Via RRAM in Pure 28nm CMOS Process", Dec. 2013.

* cited by examiner

*Primary Examiner* — Eduardo A Rodela
(74) *Attorney, Agent, or Firm* — WPAT, P.C.; Justin King

(57) ABSTRACT

A cell structure of a non-volatile memory includes a first metal layer, a first dielectric layer, a first transition layer, a second metal layer, a second dielectric layer, a second transition layer, and a third metal layer. The first dielectric layer is disposed over the first metal layer, and has a first via. The first transition layer is arranged between the first via and the first metal layer. The second metal layer is formed within the first via and contacted with the first transition layer. The second dielectric layer is disposed over the second metal layer and the first dielectric layer, and has a second via. The second transition layer is arranged between the second via and the second metal layer. The third metal layer is formed within the second via and contacted with the second transition layer.

18 Claims, 6 Drawing Sheets

RESISTIVE NON-VOLATILE MEMORY, CELL STRUCTURE AND MANUFACTURING METHOD THEREOF

This application claims the benefit of Taiwan Patent Application No. 103101392, filed Jan. 15, 2014, the subject matter of which is incorporated herein by reference.

FIELD OF THE INVENTION

The present invention relates to a memory and a manufacturing method thereof, and more particularly to a resistive non-volatile memory, a cell structure, and a manufacturing method thereof.

BACKGROUND OF THE INVENTION

As is well known, a non-volatile memory is able to continuously retain data after the supplied power is interrupted. A flash memory is one of the most popular non-volatile memories. Generally, each storage cell of the flash memory has a floating gate transistor. The storing status of the floating gate transistor may be determined according to the amount of the stored charges.

Recently, a novel non-volatile memory with a resistive element as the main storage element has been introduced into the market. This non-volatile memory is also referred as a resistive random access memory (RRAM).

FIG. 1 is a schematic cross-sectional view illustrating a conventional non-volatile memory with a resistive element. This non-volatile memory is disclosed in U.S. Pat. No. 8,107,274 for example. As shown in FIG. 1, the non-volatile memory 300 has a (1T+1R) cell. The term "1T" denotes one transistor. The term "1R" denotes one resistor. That is, the non-volatile memory 300 comprises a transistor 310 and a resistive element 320. The resistive element 320 is connected to the transistor 310. In addition, the resistive element 320 is a variable and reversible resistive element.

The transistor 310 comprises a substrate 318, a gate dielectric layer 313, a gate electrode 312, a first source/drain region 314, a second source/drain region 316, and a spacer 319.

The resistive element 320 comprises a transition metal oxide layer 110, a dielectric layer 150, and a conductive plug module 130. The dielectric layer 150 is formed on the first source/drain region 314. The conductive plug module 130 is disposed on the transition metal oxide layer 110.

The conductive plug module 130 comprises a metal plug 132 and a barrier layer 134. The metal plug 132 is vertically disposed over the transition metal oxide layer 110, and electrically connected with the transition metal oxide layer 110. The barrier layer 134 is arranged around the metal plug 132. The transition metal oxide layer 110 is formed by reacting a portion of the dielectric layer 150 with the barrier layer 134. The transition metal oxide layer 110 is capable of changing resistance.

Since the transistor 310 occupies the layout area of the substrate, the cell density of the (1T+1R) cells of the non-volatile memory 300 is relatively lower.

Therefore, there is a need of providing a non-volatile memory with high cell density in order to overcome the problems of the conventional technology.

SUMMARY OF THE INVENTION

An embodiment of the present invention provides a cell structure of a non-volatile memory. The cell structure includes a first metal layer, a first dielectric layer, a first transition layer, a second metal layer, a second dielectric layer, a second transition layer, and a third metal layer. The first dielectric layer is disposed over the first metal layer, wherein the first dielectric layer has a first via. The first transition layer is arranged between a bottom of the first via and the first metal layer. The second metal layer is formed within the first via and contacted with the first transition layer. The second dielectric layer is disposed over the second metal layer and the first dielectric layer, wherein the second dielectric layer has a second via. The second transition layer is arranged between a bottom of the second via and the second metal layer. The third metal layer is formed within the second via and contacted with the second transition layer.

Another embodiment of the present invention provides a method for manufacturing a cell structure of a non-volatile memory. Firstly, a first metal layer is provided. Then, a first dielectric layer is formed over the first metal layer. Then, a first via is formed in the first dielectric layer, wherein a bottom of the first via is in contact with the remaining first dielectric layer. Then, a first barrier layer is formed on an inner surface of the first via. Then, a second metal layer is filled into the first via. Then, a second dielectric layer is formed over the second metal layer and the first dielectric layer. Then, a second via is formed in the second dielectric layer. A bottom of the second via is in contact with the remaining second dielectric layer. The second via is disposed over the second metal layer. Then, a second barrier layer is formed on an inner surface of the second via. Then, a third metal layer is filled into the second via. Afterwards, the first dielectric layer and the first barrier layer at the bottom of the first via are reacted with each other to form a first transition layer, and the second dielectric layer and the second barrier layer at the bottom of the second via are reacted with each other to form a second transition layer.

A further embodiment of the present invention provides a non-volatile memory. The non-volatile memory includes a first metal line, a first cell structure, a second cell structure, a second metal line, a third metal line, a third cell structure, a fourth cell structure, and a fourth metal line. A first end of the first cell structure is connected to the first metal line. A first end of the second cell structure is connected to the first metal line. The second metal line is connected to a second end of the first cell structure. The third metal line is connected to a second end of the second cell structure. A first end of the third cell structure is connected to the second metal line. A first end of the fourth cell structure is connected to the third metal line. The fourth metal line is connected to a second end of the third cell structure and a second end of the fourth cell structure. Each of the first cell structure, the second cell structure, the third cell structure and the fourth cell structure comprises a first transition layer and a second transition layer, which are connected with each other in series.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a resistive non-volatile memory, a cell structure, and a manufacturing method thereof. The resistive non-volatile memory has a (1D+1R) cell. The term "1D" denotes one diode. The term "1R" denotes one resistor. That is, the resistive non-volatile memory comprises a diode and a resistive element. Since plural cell structures are arranged in a three-dimensional configuration, the cell density of the resistive non-volatile memory is increased. The concepts of the resistive non-volatile memory will be illustrated as follows.

Figure 1:
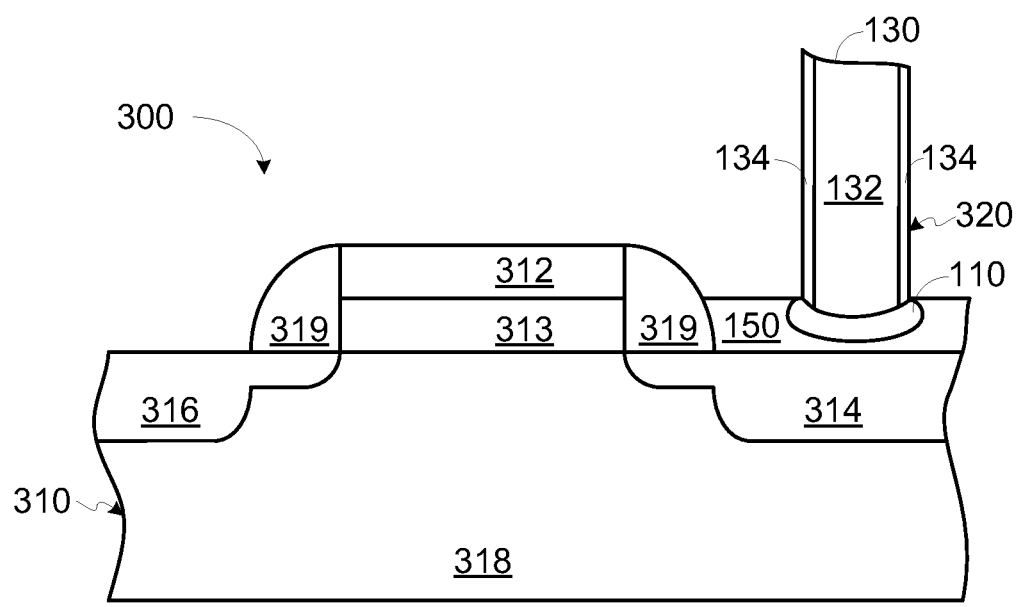
FIG. 1 (prior art) is a schematic cross-sectional view illustrating a conventional non-volatile memory with a resistive element.
Figure 2A:
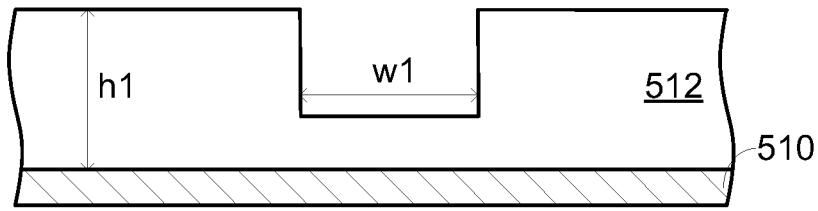
FIGS. 2A~2J schematically illustrate a method of manufacturing a cell structure of a resistive non-volatile memory and an equivalent circuit of the cell structure according to an embodiment of the present invention.
Figure 2B:
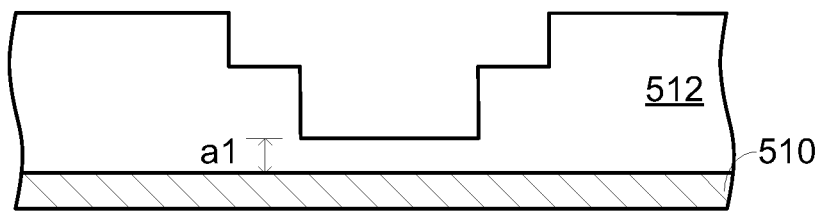
Figure 2C:
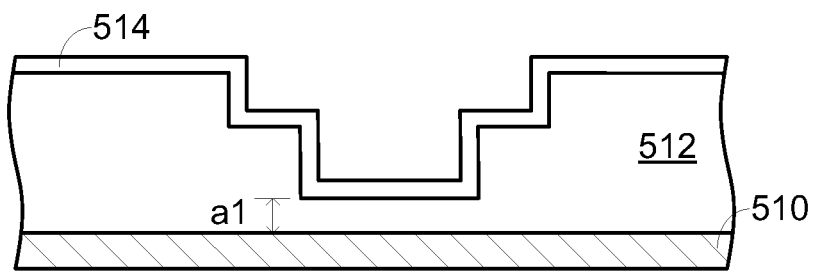
Figure 2D:
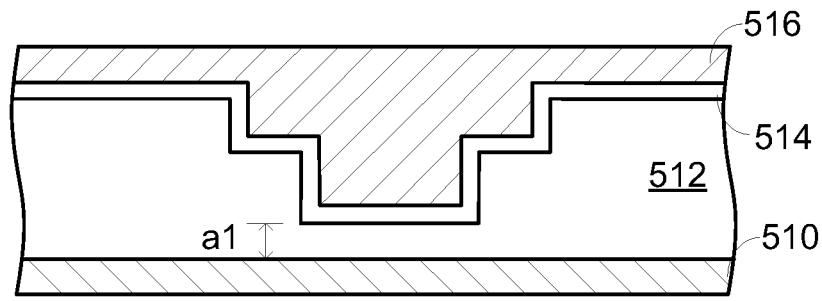
Figure 2E:
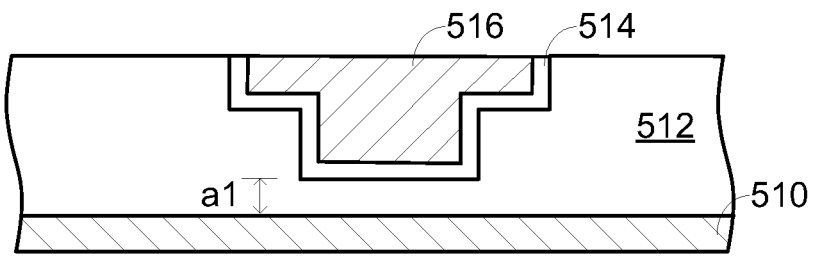
Figure 2F:
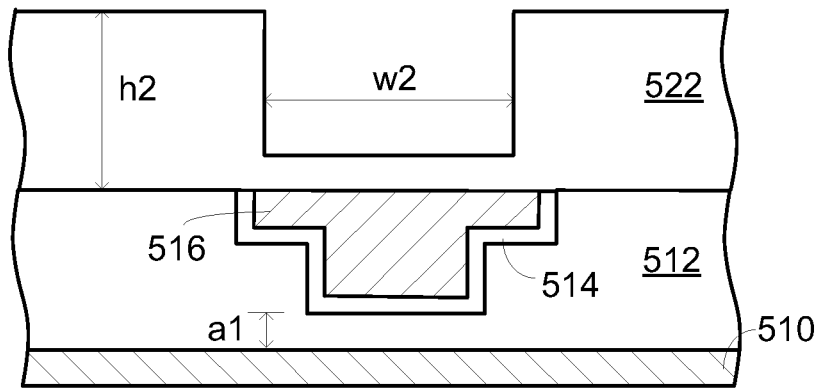
Figure 2G:
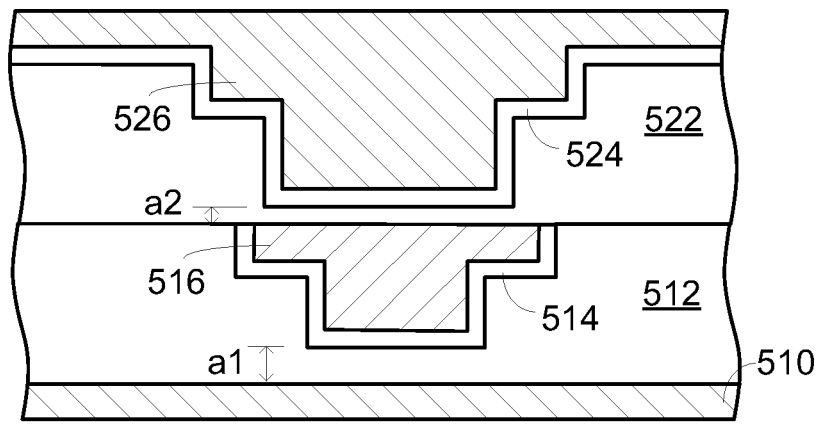
Figure 2H:
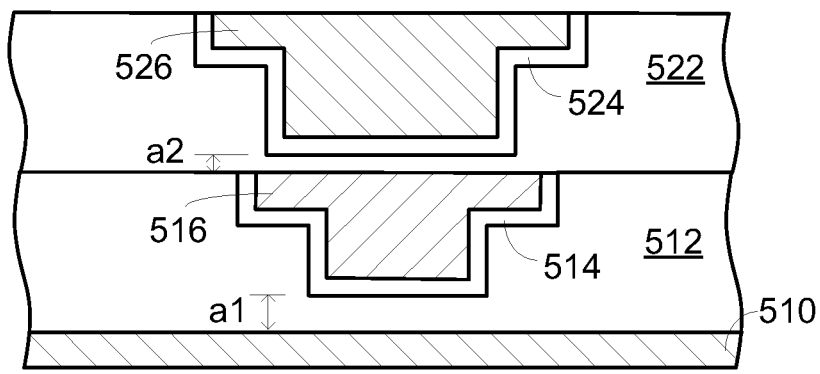

FIGS. 2A~2J schematically illustrate a method of manufacturing a cell structure of a resistive non-volatile memory and an equivalent circuit of the cell structure according to an embodiment of the present invention. In FIGS. 2A~2E, the steps of forming the resistive element are shown. In FIGS. 2F~2H, the steps of forming the diode are shown.

Please refer to FIG. 2A. Firstly, a first metal layer 510 is provided, and a first dielectric layer 512 with a thickness h1 is formed on a first surface of the first metal layer 510. For example, the first dielectric layer 512 is an inter-metal dielectric layer (also referred as an IMD layer). In addition, the first dielectric layer 512 is made of silicon dioxide ($SiO_2$). Then, an etching process is performed to define a first via in the first dielectric layer 512, wherein the first via has a width w1. The bottom of the first via is in contact with the remaining first dielectric layer 512. Generally, the cell structure of the present invention is formed on a semiconductor substrate. Moreover, the first metal layer 510 is a metal line and arranged along a first direction. The first metal layer 510 is made of copper, aluminum or tungsten.

Then, as shown in FIG. 2B, an additional etching process is performed to partially remove the first dielectric layer 512 near an upper portion of the first via. Consequently, the width of the upper portion of the first via is larger than w1, and the thickness of the remaining first dielectric layer 512 underlying the bottom of the first via is a1.

Then, as shown in FIG. 2C, a first barrier layer 514 is formed on the inner surface of the first via and the top surface of the first dielectric layer 512. For example, the first barrier layer 514 is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

Then, as shown in FIG. 2D, a second metal layer 516 is formed on the first barrier layer 514 and filled in the first via. The second metal layer 516 is made of copper, aluminum or tungsten.

Then, as shown in FIG. 2E, a chemical mechanical polishing (CMP) process or an etching process is performed to partially remove the second metal layer 516 and the first barrier layer 514. Consequently, the top surface of the second metal layer 516 and the top surface of the first dielectric layer 512 are flattened.

Then, as shown in FIG. 2F, a second dielectric layer 522 with a thickness h2 is formed on the top surface of the second metal layer 516 and the top surface of the first dielectric layer 512. The second dielectric layer 522 is also an inter-metal dielectric layer (also referred as an IMD layer). In addition, the second dielectric layer 522 is made of silicon dioxide ($SiO_2$). Then, an etching process is performed to define a second via in the second dielectric layer 522, wherein the second via has a width w2. The bottom of the first via is in contact with the remaining second dielectric layer 522.

Then, as shown in FIG. 2G, an additional etching process is performed to partially remove the second dielectric layer 522 near an upper portion of the second via. Consequently, the width of the upper portion of the second via is larger than w2, and the thickness of the remaining second dielectric layer 522 underlying the bottom of the second via is a2. Then, a second barrier layer 524 is formed on the inner surface of the second via and the top surface of the second dielectric layer 522. For example, the second barrier layer 524 is made of Hf, HfOx, HfOxNy, Mg, MgOx, MgOxNy, NiOx, NiOxNy, TaOxNy, Ta, TaOx, TaNx, TiOxNy, Ti, TiOx or TiNx. Then, a third metal layer 526 is formed on the second barrier layer 524 and filled in the second via. The third metal layer 526 is made of copper, aluminum or tungsten.

Then, as shown in FIG. 2H, a chemical mechanical polishing (CMP) process or an etching process is performed to partially remove the third metal layer 526 and the second barrier layer 524. Consequently, the top surface of the third metal layer 526 and the top surface of the second dielectric layer 522 are flattened. Moreover, the third metal layer 526 within the second via is a metal line and arranged along a second direction, wherein the first direction and the second direction are perpendicular to each other.

Figure 2I:
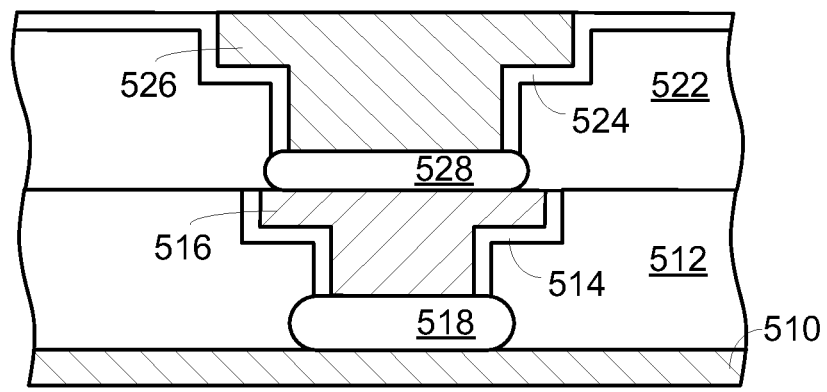

After a specified reaction is carried out, the single cell structure of the resistive non-volatile memory is provided. The cell structure is shown in FIG. 2I. By this reaction, the first dielectric layer 512 and the first barrier layer 514 at the bottom of the first via are reacted with each other to form a first transition layer 518, and the second dielectric layer 522 and the second barrier layer 524 at the bottom of the second via are reacted with each other to form a second transition layer 528. In this embodiment, the first transition layer 518 may be considered as a resistive element, and the second transition layer 528 may be considered as a diode. Moreover, each of the first transition layer 518 and the second transition layer 528 is made of HfOx, HfOxNy, MgOx, MgOxNy, NiOx, NiOxNy, TaOxNy, TaOx, TaNx, TiOxNy, TiOx or TiNx. Among these materials, HfOx, MgOx, NiOx, TaOx and TiOx are transition metal oxides, TaNx and TiNx are transition metal nitrides, and HfOxNy, MgOxNy, NiOxNy, TaOxNy and TiOxNy are transition metal nitrogen oxide dielectric materials.

In this embodiment, the thickness of the remaining first dielectric layer 512 underlying the bottom of the first via and the thickness of the remaining second dielectric layer 522 underlying the bottom of the second via may be adjusted according to the aspect ratio of the first via and the aspect ratio of the second via. Consequently, each of the first transition layer 518 and the second transition layer 528 may be designed as the diode or the resistive element.

Figure 2J:
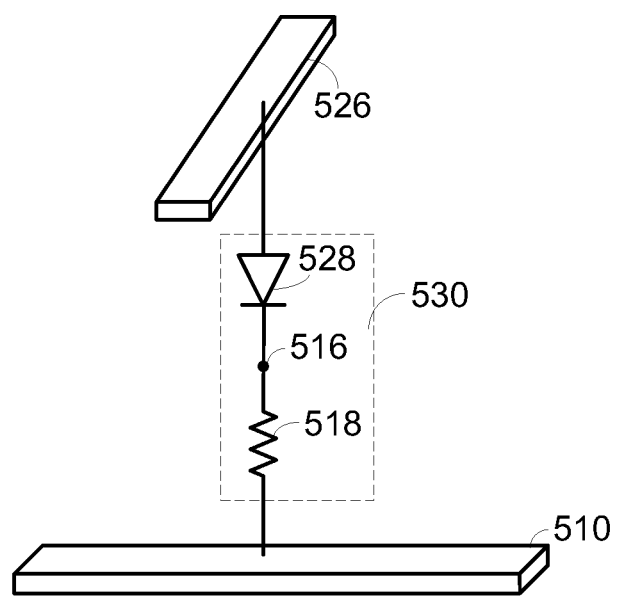

FIG. 2J schematically illustrates an equivalent circuit of the cell structure of the resistive non-volatile memory according to the embodiment of the present invention. The first metal layer 510 is the metal line arranged along the first direction. In addition, the first metal layer 510 is used as a bit line. The third metal layer 526 is the metal line arranged along the second direction. In addition, the third metal layer 526 is used as a word line. The first transition layer 518 (e.g. the resistive element), the second metal layer 516 and the second transition layer 528 (e.g. the diode) of the cell structure 530 are vertically arranged between the first metal layer 510 and third metal layer 526. The resistive element 518 is arranged between the first metal layer 510 and the second metal layer 516. The diode 528 is arranged between the second metal layer 516 and the third metal layer 526. It is noted that numerous modifications and alterations may be made while retaining the teachings of the invention. For example, in some other embodiments, the diode is arranged between the first metal layer and the second metal layer, and the resistive element is arranged between the second metal layer and the third metal layer.

Moreover, by providing a specified voltage and/or a specified current to the region between the word line and the bit line, the resistance value of the resistive element 518 of the cell structure 530 may be set or reset. For example, during a program cycle, a set voltage Vset (e.g. 3V) is provided to the region between the word line and the bit line. Consequently, the resistive element 518 is in a set status (or a first storing status), and the resistive element 518 has a low resistance value. When a reset voltage Vreset (e.g. 1V) and a rest current Ireset (e.g. 10 µA) are provided to the region between the word line and the bit line, the resistive element 518 is in a reset status (or a second storing status). Under this circumstance, the resistive element 518 has a high resistance value.

After the program cycle, the resistive element may be programmed to have the set status (or the first storing status) or the reset status (or the second storing status). During a read cycle, only a small read voltage Vread (e.g. 0.4V) is provided to the region between the word line and the bit line. According to the magnitude of the corresponding read current (or the cell current), the storing status of the cell structure can be realized. In other words, the cell structure of the resistive non-volatile memory can be selectively in the first storing status or the second storing status.

The above descriptions are related to the fabrication of a single cell structure. It is noted that a cell array composed of plural cell structures may be manufactured by repeatedly performing the above procedures.

FIGS. 3A~3D schematically illustrate a method of manufacturing a cell array of a resistive non-volatile memory and an equivalent circuit of the cell array according to an embodiment of the present invention. The detailed procedures of manufacturing the resistive element and the diode are similar to those of FIGS. 2A~2H, and are not redundantly described herein.

Figure 3A:
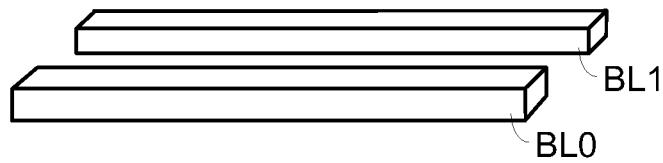
FIGS. 3A~3D schematically illustrate a method of manufacturing a cell array of a resistive non-volatile memory and an equivalent circuit of the cell array according to an embodiment of the present invention.

Firstly, as shown in FIG. 3A, a first metal layer is provided. The first metal layer comprises plural metal lines BL0 and BL1, which are arranged along a first direction. Moreover, the plural metal lines BL0 and BL1 may be used as bit lines. Moreover, the plural metal lines BL0 and BL1 are formed on a surface of a substrate (not shown).

Figure 3B:
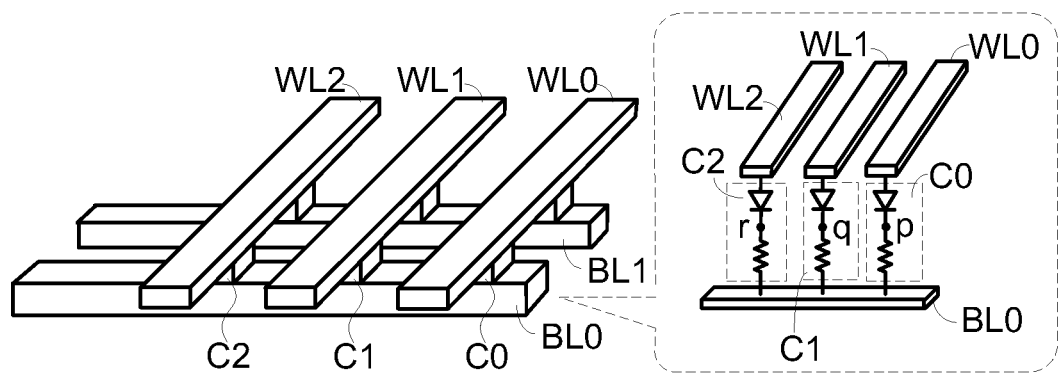

Then, the procedures of fabricating resistive elements and diodes are sequentially performed. Consequently, as shown in FIG. 3B, plural cell structures are formed on the plural metal lines BL0 and BL1.

For example, the cell structures C0, C1 and C2 are formed on the metal line BL0. In the cell structure C0, a first end of the resist element is connected to the metal line BL0, a second end of the resist element is connected to a node p, a first end of the diode is connected to the node p, and a second end of the diode is connected to the metal line WL0. In the cell structure C1, a first end of the resist element is connected to the metal line BL0, a second end of the resist element is connected to a node q, a first end of the diode is connected to the node q, and a second end of the diode is connected to the metal line WL1. In the cell structure C3, a first end of the resist element is connected to the metal line BL0, a second end of the resist element is connected to a node r, a first end of the diode is connected to the node r, and a second end of the diode is connected to the metal line WL2. The nodes p, q and r of these cell structures C0~C2 are located at a second metal layer.

Please refer to FIG. 3B again. The plural metal lines WL0, WL1 and WL2 are arranged along a second direction. In addition, the plural metal lines WL0, WL1 and WL2 may be used as word lines. Moreover, the plural metal lines WL0, WL1 and WL2 are located at the same layer (i.e. a third metal layer). The first direction and the second direction are perpendicular to each other.

Then, the procedures of fabricating resistive elements and diodes are sequentially performed. Consequently, as shown in FIG. 3C, plural cell structures are formed on the plural metal lines WL0, WL1 and WL2 of the third metal layer.

For example, the cell structures C3, C4 and C5 are formed on the metal lines WL0, WL1 and WL2, respectively. In the cell structure C3, a first end of the diode is connected to the metal line WL0, a second end of the diode is connected to a node x, a first end of the resistive element is connected to the node x, and a second end of the resistive element is connected to the metal line BL2. In the cell structure C4, a first end of the diode is connected to the metal line WL1, a second end of the diode is connected to a node y, a first end of the resistive element is connected to the node y, and a second end of the resistive element is connected to the metal line BL2. In the cell structure C5, a first end of the diode is connected to the metal line WL2, a second end of the diode is connected to a node z, a first end of the resistive element is connected to the node z, and a second end of the resistive element is connected to the metal line BL2. The nodes x, y and z of these cell structures C3~05 are located at a fourth metal layer.

Please refer to FIG. 3C again. The plural metal lines BL2 and BL3 are arranged along the first direction. In addition, the plural metal lines BL2 and BL3 may be used as the bit lines. Moreover, the plural metal lines BL2 and BL3 are located at the same layer (i.e. a fifth metal layer).

Figure 3C:
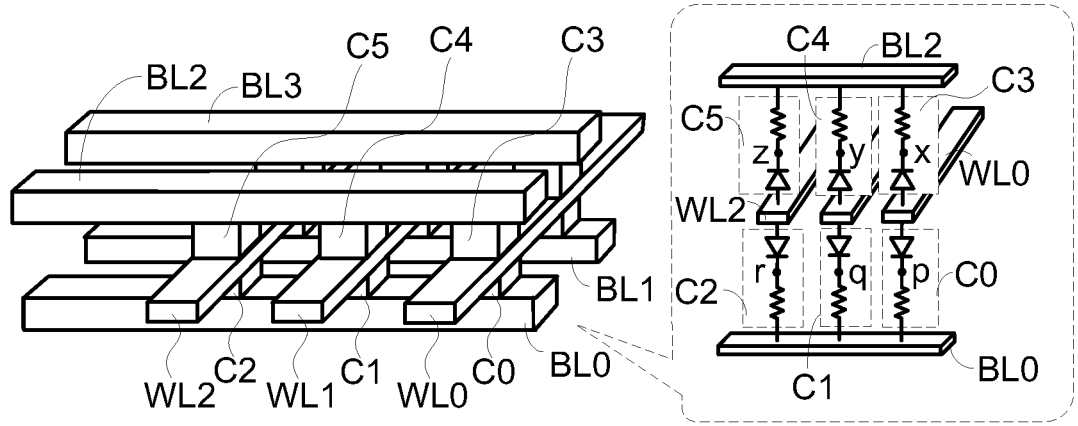
Figure 3D:
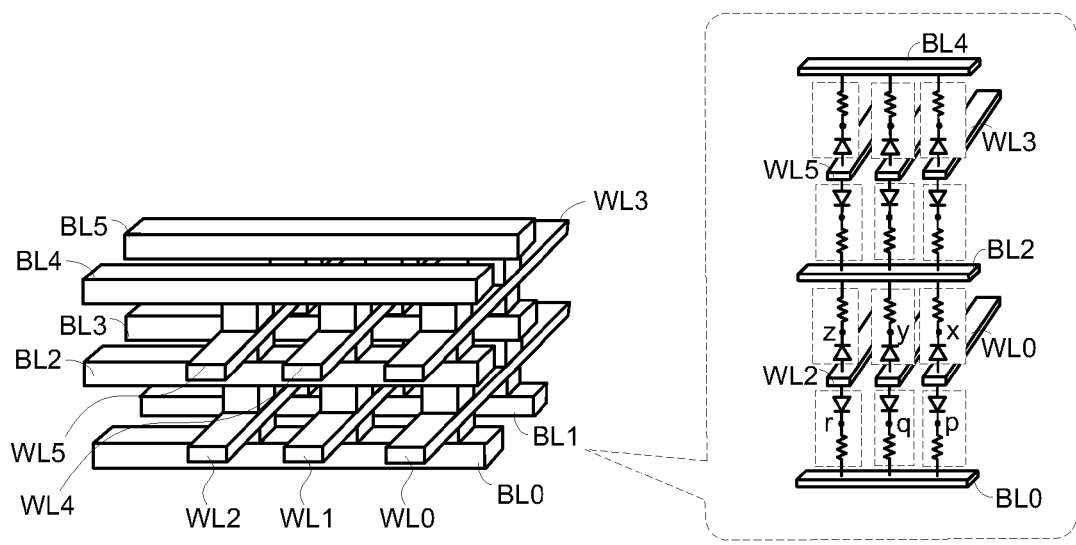

The procedures as shown in FIGS. 3B and 3C may be repeatedly done. Consequently, more cell structures are further stacked as the resulting structure of FIG. 3D. That is, plural cell structures are further defined by the plural metal lines WL3, WL4 and WL5 along the second direction and the plural metal lines BL4 and BL5 along the first direction. The procedures of fabricating these cell structures are similar to those of FIGS. 3B and 3C, and are not redundantly described herein.

Then, the above stack structure is placed into a reaction chamber. After the temperature of the reaction chamber is increased to a reaction temperature, a reaction is carried out. By this reaction, the dielectric layers and the corresponding barrier layers of the stack structure are reacted with each other to form transition layers. Meanwhile, the cell array of the resistive non-volatile memory is produced.

The operating principles of the cell array of the resistive non-volatile memory during the program cycle and the read cycle are similar to those of the single cell structure, and are not redundantly described herein.

From the above descriptions, the present invention provides a resistive non-volatile memory, a cell structure, and a manufacturing method thereof. Since the cell structure has the (1D+1R) configuration, plural cell structures can be arranged in a three-dimensional configuration. Under this circumstance, the cell density of the resistive non-volatile memory is increased.

Moreover, the resistive element and the diode of each cell structure are serially connected between two metal lines. It is noted that the sequence of forming the resistive element and the diode is not restricted. For example, in an embodiment, the diode is formed after the formation of the resistive element. Alternatively, in another embodiment, the resistive element is formed after the formation of the diode.

Moreover, the magnitudes of the set voltage Vset, the reset voltage Vreset, the reset current Ireset and the read current Vread are not restricted. However, the magnitudes of the set voltage, the reset voltage, the reset current and the read current may be varied by those skilled in the art. In addition, the set voltage, the reset voltage, the reset current and the read current are applied to the program cycle and the read cycle of the resistive non-volatile memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cell structure of a non-volatile memory, the cell structure comprising:
    a first metal layer;
    a first dielectric layer disposed over the first metal layer, wherein the first dielectric layer has a first via;
    a first transition layer arranged between a bottom of the first via and the first metal layer, wherein a first barrier layer is formed on an inner surface of the first via, and the first dielectric layer and the first barrier layer are reacted with each other to form the first transition layer;
    a second metal layer formed within the first via and contacted with the first transition layer;
    a second dielectric layer disposed over the second metal layer and the first dielectric layer, wherein the second dielectric layer has a second via;
    a second transition layer arranged between a bottom of the second via and the second metal layer, wherein a second barrier layer is formed on an inner surface of the second via, and the second dielectric layer and the second barrier layer are reacted with each other to form the second transition layer; and
    a third metal layer formed within the second via and contacted with the second transition layer.

2. The cell structure as claimed in claim 1, wherein one of the first transition layer and the second transition layer is a resistive element, and the other of the first transition layer and the second transition layer is a diode.

3. The cell structure as claimed in claim 2, wherein the resistive element has a low resistance value in a set status, and the resistive element has a high resistance in a reset status.

4. The cell structure as claimed in claim 1, wherein each of the first barrier layer and the second barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

5. The cell structure as claimed in claim 1, wherein each of the first transition layer and the second transition layer is made of HfOx, HfOxNy, MgOx, MgOxNy, NiOx, NiOxNy, TaOxNy, TaOx, TaNx, TiOxNy, TiOx or TiNx.

6. The cell structure as claimed in claim 1, wherein the first metal layer further comprises a first metal line, and the third metal layer further comprises a second metal line, wherein the first metal line is arranged along a first direction and contacted with the first transition layer, and the second metal line is arranged along a second direction, disposed within the second via and contacted with the second transition layer.

7. The cell structure as claimed in claim 6, wherein the first direction and the second direction are perpendicular to each other.

8. The cell structure as claimed in claim 1, wherein each of the first metal layer, the second metal layer and the third metal layer is made of copper, aluminum or tungsten.

9. The cell structure as claimed in claim 1, wherein each of the first dielectric layer and the second dielectric layer is made of silicon dioxide.

10. A method for manufacturing a cell structure of a non-volatile memory, the method comprising steps of:
    providing a first metal layer;
    forming a first dielectric layer over the first metal layer;
    forming a first via in the first dielectric layer, wherein a bottom of the first via is in contact with the remaining first dielectric layer;
    forming a first barrier layer on an inner surface of the first via;
    filling a second metal layer into the first via;
    forming a second dielectric layer over the second metal layer and the first dielectric layer;
    forming a second via in the second dielectric layer, wherein a bottom of the second via is in contact with the remaining second dielectric layer, and the second via is disposed over the second metal layer;
    forming a second barrier layer on an inner surface of the second via;
    filling a third metal layer into the second via; and
    allowing the first dielectric layer and the first barrier layer at the bottom of the first via to be reacted with each other to form a first transition layer, and allowing the second dielectric layer and the second barrier layer at the bottom of the second via to be reacted with each other to form a second transition layer.

11. The method as claimed in claim 10, wherein one of the first transition layer and the second transition layer is a resistive element, and the other of the first transition layer and the second transition layer is a diode.

12. The method as claimed in claim 11, wherein the resistive element has a low resistance value in a set status, and the resistive element has a high resistance in a reset status.

13. The method as claimed in claim 10, wherein each of the first barrier layer and the second barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

14. The method as claimed in claim 10, wherein each of the first transition layer and the second transition layer is made of HfOx, HfOxNy, MgOx, MgOxNy, NiOx, NiOxNy, TaOxNy, TaOx, TaNx, TiOxNy, TiOx or TiNx.

15. The method as claimed in claim 10, wherein the first metal layer further comprises a first metal line, and the third metal layer further comprises a second metal line, wherein the first metal line is arranged along a first direction and contacted with the first transition layer, and the second metal line is arranged along a second direction, disposed within the second via and contacted with the second transition layer.

16. The method as claimed in claim 15, wherein the first direction and the second direction are perpendicular to each other.

17. The method as claimed in claim 10, wherein each of the first metal layer, the second metal layer and the third metal layer is made of copper, aluminum or tungsten.

18. The method as claimed in claim 10, wherein each of the first dielectric layer and the second dielectric layer is made of silicon dioxide.

* * * * *